US006914262B2

(12) United States Patent
Hahm et al.

(10) Patent No.: US 6,914,262 B2
(45) Date of Patent: Jul. 5, 2005

(54) WHITE LIGHT EMITTING DIODE AND METHOD FOR MANUFACTURING THE SAME

(75) Inventors: Hun Joo Hahm, Kyungki-do (KR); In Eung Kim, Kyungki-do (KR); Jeong Seok Na, Seoul (KR); Seung Jin Yoo, Pyungtaek (KR); Young Ho Park, Kyungki-do (KR); Soo Min Lee, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 16 days.

(21) Appl. No.: 10/689,630

(22) Filed: Oct. 22, 2003

(65) Prior Publication Data

US 2004/0262617 A1 Dec. 30, 2004

(30) Foreign Application Priority Data

Jun. 24, 2003 (KR) .................... 10-2003-0040959

(51) Int. Cl.$^7$ ............................... H01L 27/15
(52) U.S. Cl. ..................... 257/79; 257/14; 257/21; 257/80; 257/98; 257/103; 257/184; 257/918
(58) Field of Search ..................... 257/13, 14, 21, 257/79–103, 184–189, 749, 918

(56) References Cited

U.S. PATENT DOCUMENTS 6,608,330 B1 * 8/2003 Yamada ............... 257/90
6,815,725 * 11/2004 Sugawara et al. ....... 257/89

* cited by examiner

Primary Examiner—Andy Huynh
(74) Attorney, Agent, or Firm—Lowe Hauptman & Berner, LLP

(57) ABSTRACT

Disclosed are a white light emitting diode and a method for manufacturing the white light emitting diode. The white light emitting diode comprises a conductive substrate with a light transmitting property having a surface divided into first and second areas; a first emitting unit including a first clad layer, a first active area, and a second clad layer at the first area of the conductive substrate; a second emitting unit including a third clad layer, a second active area emitting light with a wavelength to be combined with light emitted from the first active area into white light, and a fourth clad layer at the second area of the conductive substrate; and first, second and third electrodes, the first electrode connected to the second surface of the conductive substrate, the second electrode connected to the second clad layer, and the third electrode connected to the fourth clad layer.

24 Claims, 6 Drawing Sheets

WHITE LIGHT EMITTING DIODE AND METHOD FOR MANUFACTURING THE SAME

BACKGROUND OF THE INVENTION

1. Field of the Invention

The present invention relates to a white light emitting diode, and more particularly to a white light emitting diode, into which active layers for respectively emitting red, green and blue light are integrated, and a method for manufacturing the white light emitting diode.

2. Description of the Related Art

As well known to those skilled in the art, white light emitting diodes are widely used as backlights of lighting apparatuses or display units. Methods for manufacturing a white light emitting diode are mainly divided into two types, i.e., a method using a luminescent material and a method simply combining blue, red and green LEDs, which are respectively produced.

First, the method for manufacturing a white light emitting diode using a luminescent material is divided into a method using a blue light emitting diode and a method using an ultraviolet light emitting diode. For example, in the method using a blue light emitting diode, blue light is inverted in terms of wavelength into white light using a YAG (Yttrium-Aluminum-Garnet) luminescent material. That is, the blue light emitted from a blue LED excites the YAG luminescent material, thus allowing a manufactured device to emit white light.

FIG. 1a is a schematic cross-sectional view of a conventional white light emitting diode 20 using a YAG luminescent material. With reference to FIG. 1a, the white light emitting diode 20 comprises an InGaN blue LED 10 mounted on a cap of an anode lead frame 12, and a YAG luminescent material 15 surrounding the InGaN blue LED 10 within the cap. The InGaN blue LED 10 is connected to the anode lead frame 12 and a cathode lead frame 14 by wires 11 and 13, respectively. The upper surfaces of the lead frames 12 and 14, on which the InGaN blue LED 10 is mounted, are molded with a transparent material 17.

Power is supplied to the InGaN blue LED 10 through the lead frames 12 and 14, so that the InGaN blue LED 10 emits blue light. A part of the emitted blue light excites the YAG luminescent material 15. Here, the YAG luminescent material 15 is characterized in that it is excited at a peak wavelength (460 nm) of the InGaN blue LED 10, thus emitting fluorescent yellowish green light. The fluorescent yellowish green light obtained from the YAG luminescent material 15 is combined with the remaining part of the blue light emitted directly from the InGaN blue LED 10, thereby being finally emitted as white light.

The conventional white light emitting diode 20 shown in FIG. 1a is advantageous in that it does not require current regulation to be adapted in use of LEDs respectively emitting RGB (Red/Green/Blue) light. Similarly to the above method for manufacturing the conventional white light emitting diode 20, there are a method using an ultraviolet light LED and a method using RGB light luminescent materials in combination.

However, in case that the wavelength modulation is employed as described above, there are drawbacks such as the reduction of optical efficiency in exciting the luminescent material and the reduction of a color correction factor.

There is another conventional white light emitting diode using RGB LEDs. FIG. 1b is a schematic cross-sectional view of a conventional white light emitting diode 30 using RGB LEDs. With reference to FIG. 1b, the white light emitting diode 30 comprises three LEDs 23, 25 and 27, which are produced as components. The LEDs 23, 25 and 27 are mounted on a single printed circuit board 21 via wires 22. The white emitting diode 30 shown in FIG. 1b emits white light by combining different lights (for example, R, G and B light) emitted from the respective LEDs 23, 25 and 27.

Such a white light emitting diode eliminates problems raised by the use of the luminescent material, thus obtaining excellent color sensitivity. However, the above white light emitting diode requires plural LEDs, thereby increasing the production cost. Further, the above white light emitting diode must regulate the current supplied to respective LEDs so as to obtain the desired white light, thus requiring a complicated circuit configuration.

SUMMARY OF THE INVENTION

Therefore, the present invention has been made in view of the above problems, and it is an object of the present invention to provide a white light emitting diode comprising two emitting units for emitting light of two or three wavelength bands, which are combined into white light, mounted on a single conductive substrate.

It is another object of the present invention to provide a method for manufacturing the white light emitting diode.

In accordance with one aspect of the present invention, the above and other objects can be accomplished by the provision of a white light emitting diode comprising: a conductive substrate with a light transmitting property having a first surface divided into first and second areas and a second surface being opposed to the first surface; a first emitting unit including a first clad layer, a first active area, and a second clad layer, sequentially formed at the first area of the conductive substrate; a second emitting unit including a third clad layer, a second active area emitting light with a wavelength to be combined with light emitted from the first active area into white light, and a fourth clad layer, sequentially formed at the second area of the conductive substrate; and first, second and third electrodes, the first electrode connected to the second surface of the conductive substrate, the second electrode connected to the second clad layer, and the third electrode connected to the fourth clad layer.

Preferably, the conductive substrate may be made of a material, which can transmit at least blue light. More preferably, the conductive substrate may be a GaN substrate.

The first and third clad layers may be made of a first conductive-type semiconductor material, and the second and fourth clad layers may be made of a second conductive-type semiconductor material.

Preferably, the first active area of the first emitting unit may include a green active layer formed on the first clad layer, an undoped clad layer formed on the green active layer, and a blue active layer formed on the undoped clad layer, and the second active area of the second emitting unit may include an active layer for emitting red light.

More preferably, the first clad layer may be made of a first conductive-type GaN compound semiconductor material; the green active layer may be a GaN/InGaN layer with a multi-quantum well structure; the undoped clad layer may be made of a GaN compound semiconductor material; the blue active layer may be a GaN/InGaN layer with a multi-quantum well structure; and the second clad layer may be made of a second conductive-type AlGaN compound semiconductor material. Further, the second emitting unit may be made of one semiconductor material selected from the group consisting of AlGaInP, GaP, GaAs, and InN.

Preferably, the second and third electrodes may be integrally formed. The white light emitting diode may further comprise an insulating layer interposed between the first emitting unit and the second emitting unit. The insulating layer may be formed on the entire surface of the first emitting unit except for an area at which the second electrode is formed.

In accordance with a further aspect of the present invention, there is provided a white light emitting diode comprising: a conductive substrate having a first surface divided into first and second areas and a second surface being opposed to the first surface; a first emitting unit including a first clad layer, a first active area, and a second clad layer, sequentially formed at the first area of the conductive substrate; a second emitting unit, including a third clad layer, a second active area emitting light with a wavelength to be combined with light emitted from the first active area into white light, and a fourth clad layer, connected to the second area of the conductive substrate by a metal adhesive layer; and a first electrode connected to the second surface of the conductive substrate, and a second electrode connected to the second clad layer.

Preferably, the first active area of the first emitting unit may include an active layer for emitting red light, and the second active area of the second emitting unit may include a green active layer formed on the third clad layer, an undoped clad layer formed on the green active layer, and a blue active layer formed on the undoped clad layer.

More preferably, the third clad layer may be made of a first conductive-type GaN compound semiconductor material; the green active layer may be a GaN/InGaN layer with a multi-quantum well structure; the undoped clad layer may be made of a GaN compound semiconductor material; the blue active layer may be a GaN/InGaN layer with a multi-quantum well structure; and the fourth clad layer may be made of a second conductive-type AlGaN compound semiconductor material.

Further, the first emitting unit may be made of one semiconductor material selected from the group consisting of AlGaInP, GaP, GaAs, and InN.

Preferably, the conductive substrate may be a first conductive-type substrate, such as a GaAs substrate. In this case, the first and third clad layers may be made of a first conductive-type semiconductor material, and the second and fourth clad layers may be made of a second conductive-type semiconductor material.

The second emitting unit may further include a second conductive-type substrate formed on the fourth clad layer, and a third electrode formed on the second conductive-type substrate.

Preferably, the conductive substrate may be a second conductive-type GaAs substrate provided with a first conductive-type impurity area, and the third clad layer of the second emitting unit may be connected to the first conductive-type impurity area.

In this case, the first and fourth clad layers may be made of a second conductive-type semiconductor material, and the second and third clad layers may be made of a first conductive-type semiconductor material.

Preferably, the second emitting unit may include an exposed surface of the fourth clad layer, being opposed to the first conductive-type substrate, obtained by partially removing the third clad layer and the second active area, and the exposed surface of the fourth clad layer may be connected to the first conductive-type substrate by a metal adhesive layer. The second emitting unit may further include a GaN substrate formed on the fourth clad layer.

In accordance with another aspect of the present invention, there is provided a method for manufacturing a white light emitting diode, comprising the steps of: (a) preparing a conductive substrate with a light transmitting property having a first surface divided into first and second areas, and a second surface being opposed to the first surface; (b) forming a first emitting unit by sequentially stacking a first clad layer, a first active area, and a second clad layer at the first area of the conductive substrate; (c) forming a second emitting unit by sequentially stacking a third clad layer, a second active area emitting light with a wavelength to be combined with light emitted from the first active area into white light, and a fourth clad layer at the second area of the conductive substrate; and (d) forming a first electrode on the second surface of the conductive substrate, a second electrode on the second clad layer, and a third electrode on the fourth clad layer.

Preferably, the step (b) may include the sub-steps of: (b-1) sequentially stacking the first clad layer, the first active area, and the second clad layer on the first surface of the conductive substrate; (b-2) removing the obtained stack structure from the second area of the first surface of the conductive substrate; and (b-3) forming an insulating layer on a side surface of the remaining stack structure, at least adjacent to the second area. The insulating layer may be formed on the entire surface of the first emitting unit except for an area at which the second electrode is formed.

In accordance with yet another aspect of the present invention, there is provided a method for manufacturing a white light emitting diode, comprising the steps of: (a) preparing a conductive substrate having a first surface divided into first and second areas and a second surface being opposed to the first surface; (b) forming a first emitting unit by sequentially stacking a first clad layer, a first active area, and a second clad layer at the first area of the conductive substrate; (c) connecting a second emitting unit obtained by sequentially stacking a third clad layer, a second active area emitting light with a wavelength to be combined with light emitted from the first active area into white light and a fourth clad layer, to the second area of the conductive substrate by a metal adhesive layer; and (d) forming a first electrode on the second surface of the conductive substrate, and a second electrode on the second clad layer.

Preferably, the first and third clad layers may be made of a first conductive-type semiconductor material, and the second and fourth clad layers may be made of a second conductive-type semiconductor material. In this case, the method may further comprise the step of forming a second conductive-type impurity area in the first conductive-type substrate prior to the step (c), and the step (c) may include the sub-steps of: (c-1) connecting the third clad layer of the second emitting unit to the first conductive-type impurity area by a metal adhesive layer; and (c-2) connecting the fourth clad layer of the second emitting unit to the second conductive-type substrate by another metal adhesive layer.

The present invention provides a white light emitting-diode, comprising two emitting units for emitting light of two or three wavelength bands, which are combined into white light, without the use of a luminescent material, and a method for manufacturing the white light emitting diode, thereby preventing the lowering of optical efficiency due to the use of the luminescent material and obtaining excellent color sensitivity and improved optical efficiency. Further, since the two emitting units are arranged in parallel on a single conductive substrate, the white light emitting diode of the present invention can be simply manufactured at low production cost, compared to a white light emitting diode comprising a plurality of LEDs produced as separate components.

As described above, the present invention provides two preferred aspects in accordance with kinds of the conductive substrate.

One aspect employs a light transmitting conductive substrate. The first and second emitting units are grown on the light transmitting conductive substrate, and when the obtained device is packaged, the device is overturned so that the conductive substrate faces upward.

The other aspect employs a conventional conductive substrate. The first and second emitting units may be grown on the conventional conductive substrate. Alternatively, one emitting unit produced as a separate component may be connected to the substrate by a metal adhesive layer. When the obtained device is packaged, the upper surface of the substrate provided with the emitting units faces upward.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figures 2, 3A:
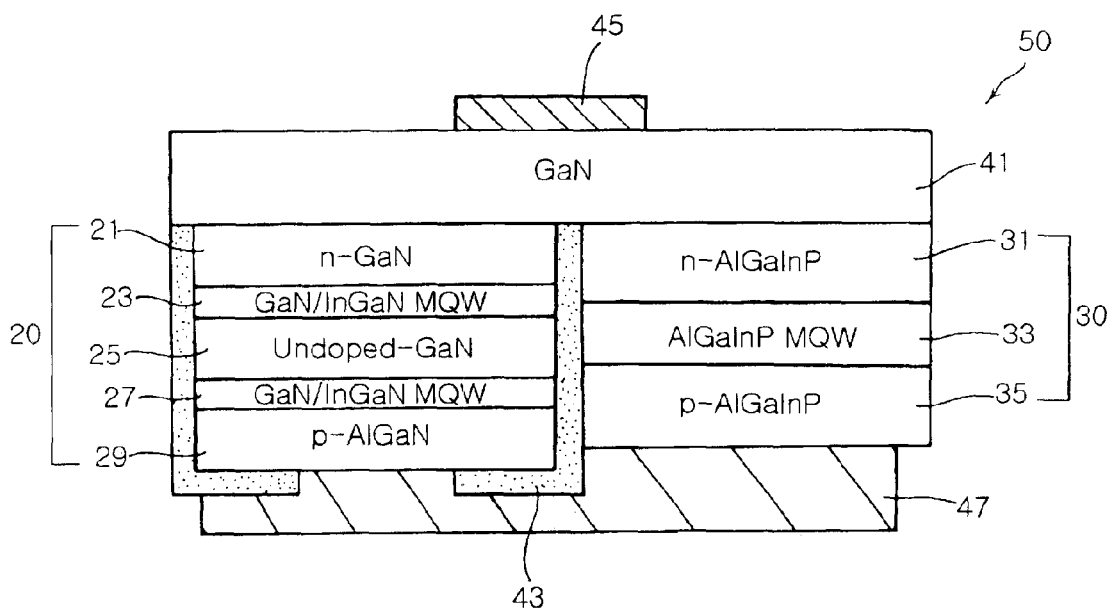
FIG. 2 is a cross-sectional view of a white light emitting diode in accordance with one embodiment of the present invention.
FIGS. 3a to 3f are cross-sectional views illustrating a method for manufacturing the white light emitting diode in accordance with one embodiment of the present invention.

FIG. 2 is a cross-sectional view of a white light emitting diode 50 in accordance with one embodiment of the present invention.

Figure 1A:
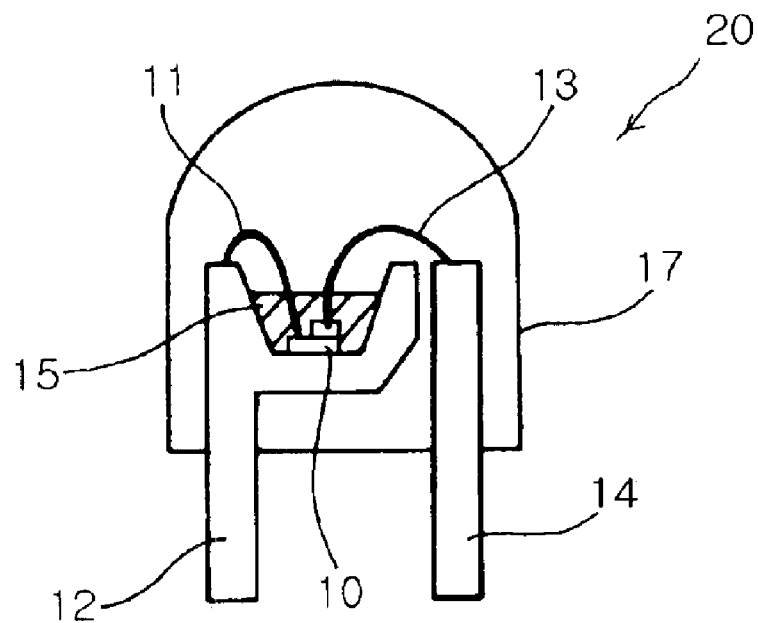
FIGS. 1a and 1b are schematic cross-sectional views respectively illustrating conventional white light emitting diodes.
Figure 1B:
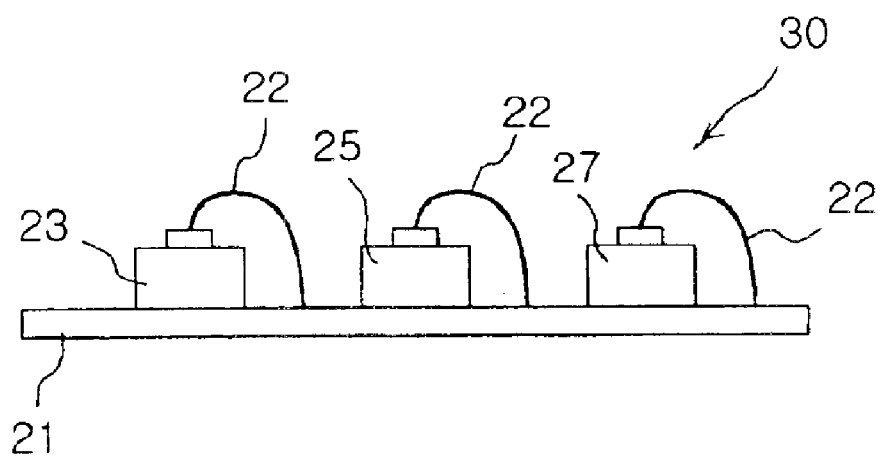

With reference to FIG. 2, the white light emitting diode 50 comprises first and second emitting units 20 and 30, which are formed in parallel on a single conductive substrate 41. As shown in FIG. 1, the first emitting unit 20 includes active layers 23 and 27 for emitting light of two different wavelength bands.

In this embodiment, the conductive substrate 41 includes a GaN single crystalline substrate having a large energy band gap; which can transmit at least red or blue light. Further, the active layer 23 of the first emitting unit 20 is a GaN/InGaN active layer with a multi-well structure for emitting blue light, and the other active layer 27 of the first emitting unit 20 is a GaN/InGaN active layer with a multi-well structure for emitting green light.

As shown in FIG. 2, the first emitting unit 20 arranged on one area of one surface of the conductive GaN substrate 41 includes an n-type GaN clad layer 21 and a p-type AlGaP clad layer 29, formed on the GaN substrate 41. The blue active layer 23 is formed on the n-type GaN clad layer 21, and the green active layer 27 is interposed between an undoped GaN clad layer 25 and the p-type AlGaP clad layer 29.

Here, the difference between energy band gaps of the blue active layer 23 and the green active layer 27 is smaller than the energy band gap of an active layer for emitting red light. More specifically, the energy band gap for emitting red light is approximately 1.3~2 eV, while the energy band gap for emitting blue light is approximately 3.3 eV and the energy band gap for emitting green light is approximately 2.8~2.9 eV. Accordingly, the vertical arrangement of the active layers 23 and 27 allows the active layers 23 and 27 to emit desired light, respectively. In order to achieve the above vertical arrangement of the active layers 23 and 27, the undoped clad layer 25 simultaneously serving as the p-type clad layer of the blue active layer 23 and the n-type clad layer of the green active layer 27 is interposed between the blue and green active layers 23 and 27.

In case that the first emitting unit 20 emits light of two different wavelength bands corresponding to blue and green light as described in the above embodiment, preferably, the blue active layer 23 is located closer to the GaN single crystalline substrate 41 than the green active layer 27. More specifically since the white light emitting diode 50 of this embodiment is used under the condition in which the GaN single crystalline substrate 41 faces upward, preferably the active layer and GaN single crystalline layers, which have a relatively larger energy band gap, are arranged close to the substrate 41 so that the light emitted from the active layer having a relatively smaller energy band gap easily transmits the device toward the upper portion. Accordingly, preferably, the blue active layer 23 with a relatively large energy band gap is arranged closer to the substrate 41 than the green active layer 27.

Further, the second emitting unit 30 arranged on another area of the same surface of the conductive GaN substrate 41 includes an n-type AlGaInP clad layer 31, an AlGaInP active layer 33 with a multi-well structure for emitting red light, and a p-type AlGaInP clad layer 35.

The first and second emitting units 20 and 30 are arranged in parallel on the same surface of the conductive substrate 41 so that the first and second emitting units 20 and 30 are electrically separated from each other. Such a separated structure is obtained by forming an insulating layer 43 between facing side surfaces of the first and second emitting units 20 and 30. Also, the insulating layer 43 is formed on the entire surface of the first emitting unit 20 except for an opening for forming an electrode, thus serving as a protective layer.

The white light emitting diode 50 of this embodiment further comprises an n-type electrode 45 formed on the other surface of the GaN single crystalline substrate 45, and a p-type electrode 47 formed on the p-type clad layers 29 and, 35 of the first and second emitting units 20 and 30. The two electrodes 45 and 47 serve as common electrodes of the first and second emitting units 20 and 30, and form a vertical structure in which current flows in a vertical direction. Accordingly, compared to a conventional LED structure in which current flows in a horizontal direction, the white light emitting diode of this embodiment of the present invention has improved current efficiency.

Preferably, as shown in FIG. 2, the p-type electrode 47 formed on the p-type clad layers 29 and 35 has a flat lower surface so that the white light emitting diode 50 is mounted on a certain lead frame. The structure of a package obtained by mounting the white light emitting diode 50 on the lead frame will be-described by FIG. 4 in more detail.

As described above, the white light emitting diode of this embodiment of the present invention emits desired white light by combining the blue and green light emitted from the first emitting unit and the red light emitted from the second emitting unit, but is not limited thereto.

For example, the first emitting unit includes an active area for emitting reddish yellow light with a wavelength band of approximately 450 nm~550 nm, and the second emitting unit includes an active area for emitting a bluish green light with a wavelength band of approximately 630 nm~780 nm, so that the two lights are combined to form desired white light.

Now, a method for manufacturing the white light emitting diode in accordance with one embodiment of the present invention will be described in detail with reference to FIGS. 3a to 3f. FIGS. 3a to 3f are cross-sectional views illustrating the method for manufacturing a white light emitting diode similar to the white light emitting diode of FIG. 2.

First, as shown in FIG. 3a, a conductive substrate 111 having a flat upper surface is prepared. The substrate employed in the present invention must be a conductive substrate for forming vertically structured emitting units, and preferably is a light transmitting substrate for easily transmitting light at all visible light bands. More preferably, the substrate employed in the present invention is a GaN single crystalline substrate with a large energy band gap.

Figure 3B:
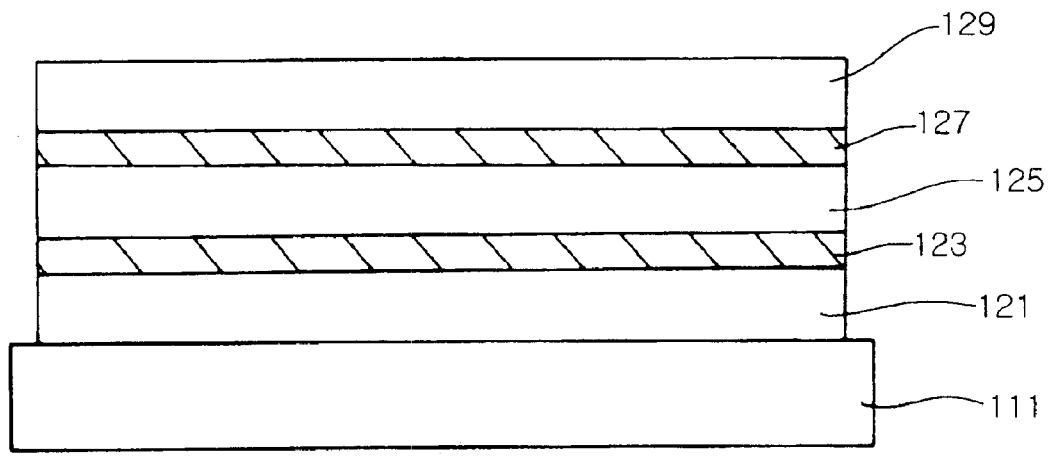
Figure 3C:
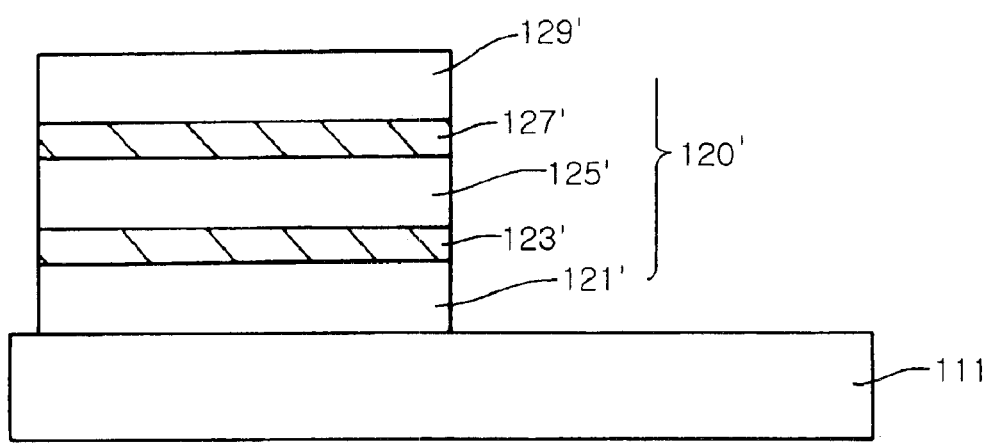

Thereafter, a single crystalline layer for forming a first emitting unit is formed on one area of the upper surface of the conductive substrate 111. As shown in FIGS. 3b and 3c, the single crystalline layer is achieved by growing a single crystalline layer on the entire upper surface of the conductive substrate 111 and then removing the single crystalline layer at an area where a second emitting unit will be formed.

More specifically, as shown in FIG. 3b, there is performed a first growth step, in which a first clad layer 121, a first active layer 123, an undoped clad layer 125, a second active layer 127 and a second clad layer 129 are sequentially stacked on the upper surface of the conductive substrate 111. In case that the first emitting unit consists of a blue light emitting unit and a green light emitting unit, preferably, the first clad layer 121 is an n-type GaN clad layer, and the first active layer 123 is a GaN/InGaN active layer with a multi-quantum well structure for emitting blue light. Further, preferably, the undoped clad layer 125 is an intrinsic GaN clad layer, the second active layer 127 is a GaN/InGaN active layer with a multi-quantum well structure for emitting green light, and the second clad layer 129 is a p-type AlGaP clad layer.

Then, the first-grown single crystalline structures 121, 123, 125, 127 and 129 are selectively etched so that the area for forming the second emitting unit on the upper surface of the conductive substrate 111 is exposed. FIG. 3c shows the selectively removed structures 121', 123', 125', 127' and 129' in order to form the area for forming the second emitting unit. Here, the remaining structures 121', 123', 125', 127' and 129' form a first emitting unit 120'. The outer edge of the first emitting unit 120' can be additionally etched so that the upper surface of the conductive substrate 111 surrounding the first emitting unit 120' is exposed. The above additionally etched outer edge of the first emitting unit 120' is used as an area for forming an insulating layer on the entire surface of the first emitting unit 120' except for an opening for forming an electrode.

Figure 3D:
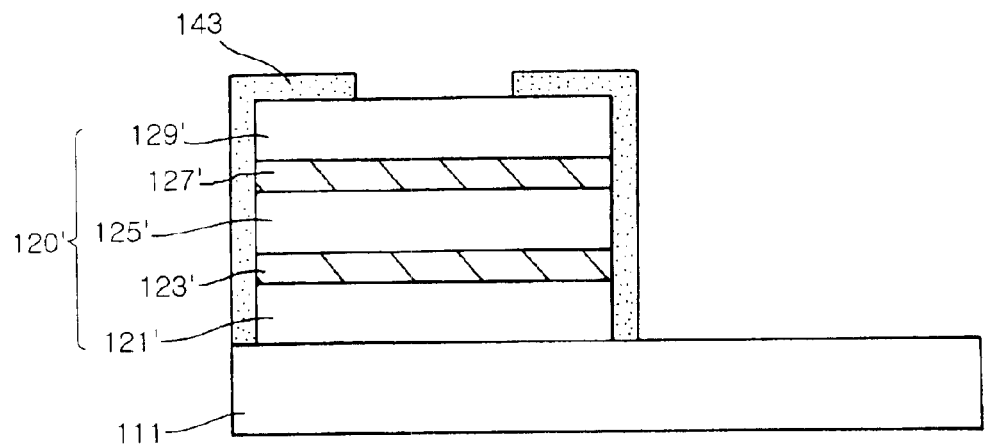

That is, as shown in FIG. 3d, an insulating layer 143 is formed on the entire surface of the first emitting unit 120' except for the opening for forming the electrode. The insulating layer 143 is a conventional insulating layer, made of $SiO_2$, SiN, or etc. The insulating layer 143 shown in FIG. 3d serves to separate the first emitting unit 120' from the second emitting unit (130 in FIG. 3e) to be formed on the exposed area of the conductive substrate 111, and functions as a protective layer for preventing the first emitting unit 120' from oxidation. In accordance with another embodiment of the present invention, a second emitting unit, which is produced as a separate component, may be mounted at an area separated from a first emitting unit on the conductive substrate by a metal adhesive layer.

Figure 3E:
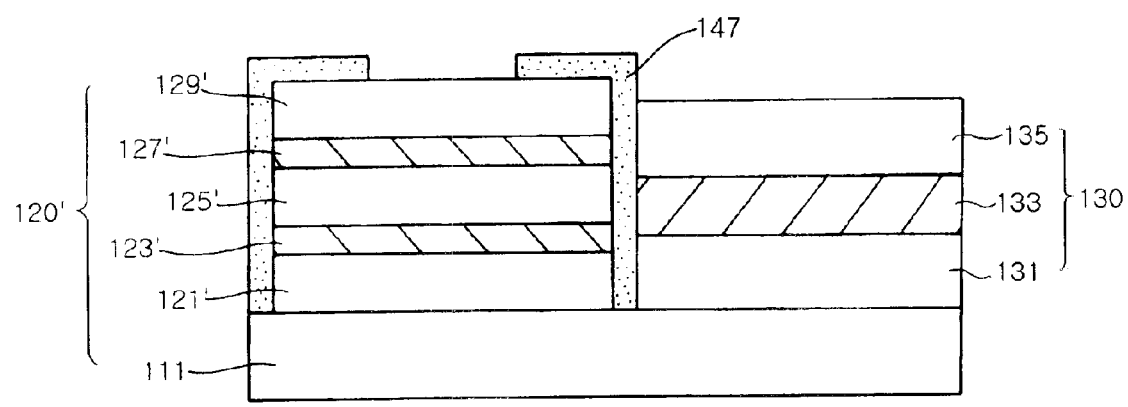

As shown in FIG. 3e, there is performed a second growth step, in which a third clad layer 131, a third active layer 133 and a fourth clad layer 135 are sequentially stacked on the exposed area of the upper surface of the conductive substrate 111. In case that the second emitting unit 130 emits red light as shown in FIG. 2, preferably, the third clad layer 131 is an n-type AlGaInP clad layer, the third active layer 133 is an AlGaInP active layer with a multi-quantum well structure, and the fourth clad layer 135 is a p-type AlGaInP clad layer.

Figure 3F:
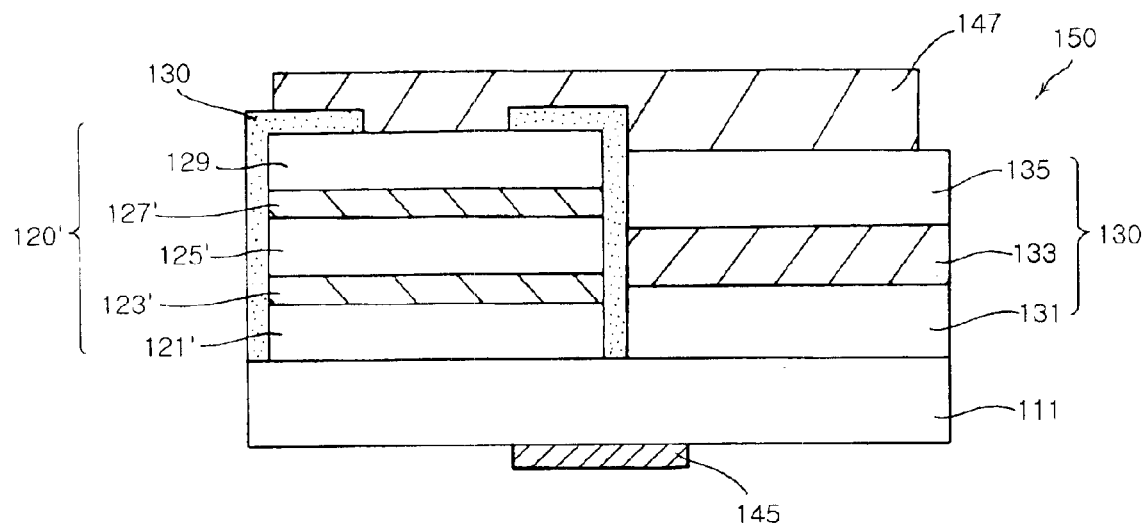

Finally, a first electrode 145 is formed on the other surface of the conductive substrate 111, and a second electrode 147 is formed on the upper surfaces of the second clad layer 129' and the fourth clad layer 135. Thereby, as shown in FIG. 3f, a desired white light emitting diode 150 is produced. When the white light emitting diode 150 shown in FIG. 3f is mounted on a lead frame, the white light emitting diode 150 is overturned so that the second electrode 147 is mounted on the lead frame as shown in FIG. 2.

Figure 4:
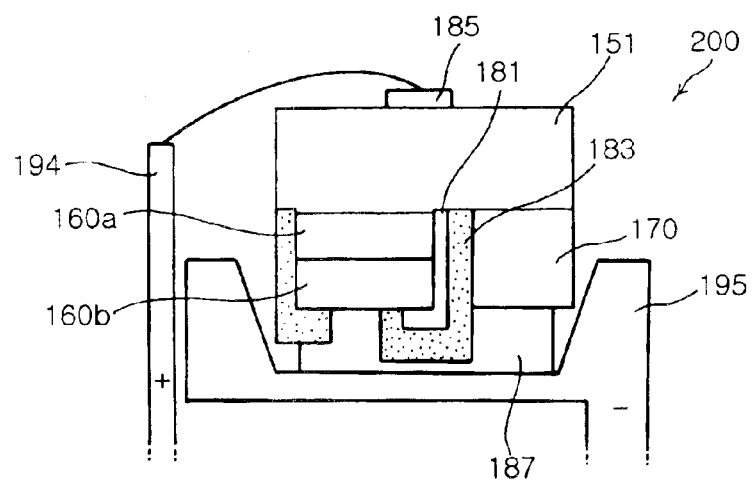
FIG. 4 is a cross-sectional view of a white light emitting diode package in accordance with one embodiment of the present invention.

FIG. 4 is a cross-sectional view of a white light emitting diode package in accordance with one embodiment of the present invention.

The white light emitting diode package 200 shown in FIG. 4 comprises a white light emitting diode with a structure similar to that of the white light emitting diode 150 shown in FIG. 3f. The above white light emitting diode comprises a first emitting unit having a blue light emitting unit 160a and a green light emitting unit 160b, and a second emitting unit 170 serving as a red light emitting unit.

The white light emitting diode is mounted on the area of a cap on a first lead frame 195 so that a conductive substrate 151 faces upward. A first electrode 185 of the white light emitting diode is connected to the first lead frame 195 by a wire, and a second electrode 187 of the white light emitting diode is mounted on the first lead frame 195. The conductive substrate 151 employed by this embodiment is a light transmitting substrate, which can transmit light generated from the emitting units 160a, 160b and 170 toward the upper surface. Thus, the white light emitting diode generates white light by combining three lights emitting from the emitting units 160a, 160b and 170.

As shown in FIG. 4, the white light emitting diode of the present invention may additionally comprise a reflective layer 181 interposed between the insulating layer 183 and the first emitting unit, i.e., the blue and green light emitting units 160a and 160b, thereby improving optical efficiency.

In accordance with another embodiment of the present invention, a conductive substrate without a light transmitting property may be employed. In this case, the white light emitting diode is packaged so that the upper surface of the substrate provided with emitting units faces upward. Further, in this embodiment, a second emitting unit, which is produced as a separate component, may be mounted on the conductive substrate by a metal adhesive layer.

Figure 5:
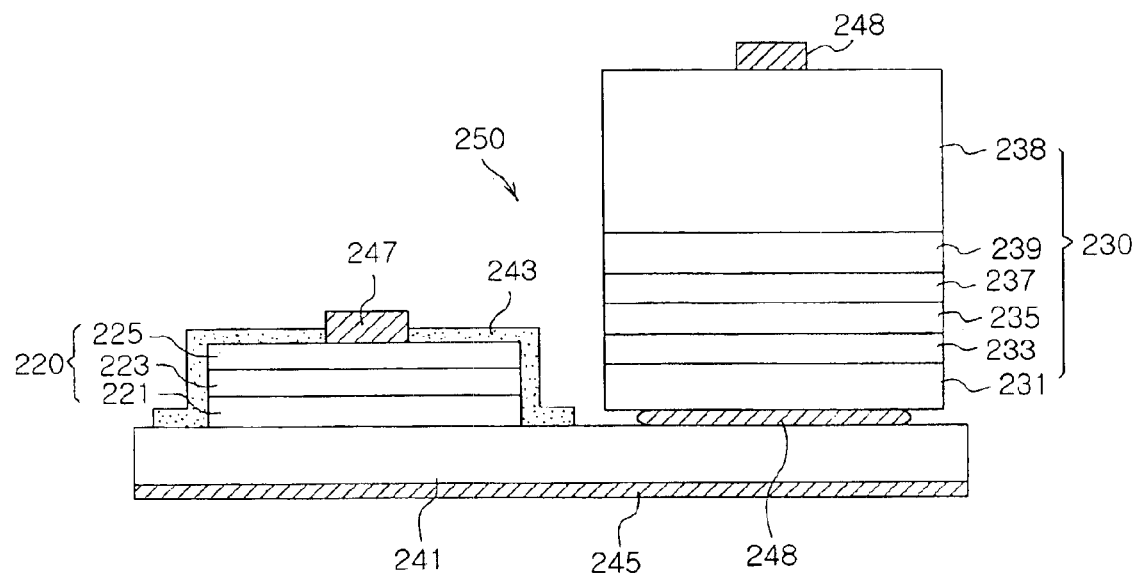
FIG. 5 is a cross-sectional view of a white light emitting diode in accordance with another embodiment of the present invention.

FIG. 5 is a cross-sectional view of a white light emitting diode 250 in accordance with another embodiment of the present invention. In this embodiment, a second emitting unit 230, produced as a separate component, is connected to a conductive substrate 241 by a metal adhesive layer 248.

With reference to FIG. 5, the white light emitting diode 250 comprises a p-type GaAs conductive substrate 241, and first and second emitting units 220 and 230 formed on the conductive substrate 241. The conductive substrate 241 employed by this embodiment does not require a light transmitting property the same as the substrate 41 shown in FIG. 2, but is suitable to grow the first emitting unit 220 thereon.

The first emitting unit 200 is formed on one area of the p-type GaAs substrate 241, and includes a p-type AlGaInP clad layer 221, an AlGaInP red active layer 223 with a multi-quantum well structure for emitting red light, and an n-type AlGaInP clad layer 225. The first emitting unit 200 is obtained by growing the p-type AlGaInP clad layer 221, the AlGaInP red active layer 223 and the n-type AlGaInP clad layer 225 directly on the p-type GaAs substrate 241. More specifically, the p-type AlGaInP clad layer 221, the AlGaInP red active layer 223 and the n-type AlGaInP clad layer 225 are grown on the p-type GaAs substrate 241, and then selectively etched at an area for mounting the second emitting unit 230 thereon. Thereafter, an insulating layer 243 made of $SiO_2$ is formed on the entire surface of the first emitting unit 220 except for an area for forming an n-type electrode 247 thereon.

The second emitting unit 230 is formed on the area different from the area for forming the first emitting unit 220 thereon, and includes a p-type AlGaP clad layer 231, a GaN/InGaN green active layer 233 with a multi-quantum well structure, an undoped GaN clad layer 235, a GaN/InGaN blue active layer 235 with a multi-quantum well structure, and an n-type GaN clad layer 239. The second emitting unit 230 may be a separate component grown on an n-type GaN substrate 238 by a separate process, and then connected to the p-type GaAs substrate 241 by a metal adhesive layer 248.

A p-type electrode 245 is formed on the lower surface of the p-type GaAs substrate 241, and n-type electrodes 247 and 248 are respectively formed on the n-type clad layer 225 of the first emitting unit 220 and the n-type substrate 238 of the second emitting unit 230. Since the second emitting unit 230 of this embodiment is produced as a separate component and then connected to the p-type GaAs substrate 241, the n-type electrode 248 is formed in advance on the n-type substrate 238 of the second emitting unit 230, and then the second emitting unit 230 is connected to the p-type GaAs substrate 241.

The same as the earlier embodiment shown in FIG. 2, the white light emitting diode 250 of this embodiment comprises the first and second emitting units 220 and 230 arranged in parallel on the same surface of the p-type GaAs substrate 241, and p-type and n-type electrodes 245, and 247 and 248 formed on the lower and upper surfaces of the obtained structure. When the white light emitting diode 250 is packaged, the surface of the p-type GaAs substrate 241 provided with the first and second emitting units 220 and 230 faces upward, that is, the n-type electrodes 247 and 248 face upward, and the n-type electrodes 247 and 248 are connected to a lead frame (not shown) by wire-bonding.

Figure 6:
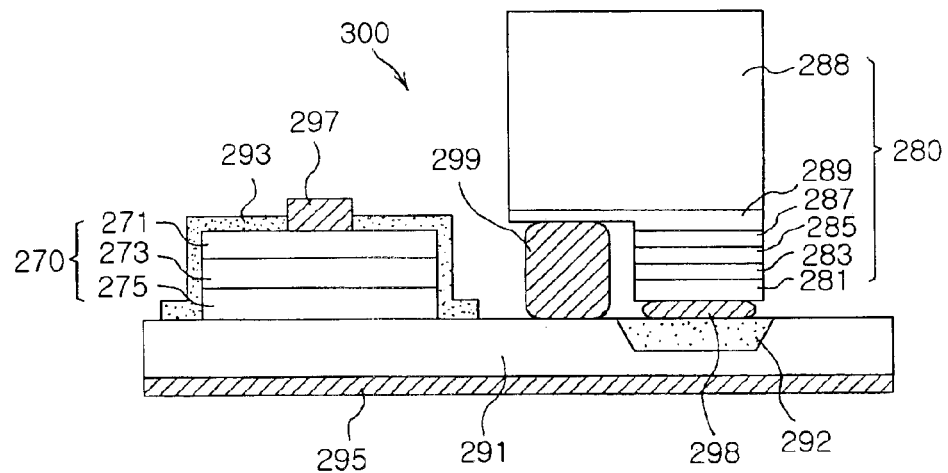
FIG. 6 is a cross-sectional view of a white light emitting diode in accordance with yet another embodiment of the present invention.

FIG. 6 is a cross-sectional view of a white light emitting diode 300 in accordance with yet another embodiment of the present invention. The white light emitting diode, 300 of this embodiment comprises an n-type GaAs substrate 291 different from the white light emitting diode 250 of the earlier embodiment shown in FIG. 5, and uses a different method for connecting a second emitting unit 280 to the n-type GaAs substrate 291.

With reference to FIG. 6, the white light emitting diode 300 comprises the n-type GaAs substrate 291, and first and second emitting units 270 and 280 formed on the n-type GaAs substrate 291. The substrate 291 employed in this embodiment is made of GaAs, the same as the substrate 241 shown in FIG. 5, but is an n-type differing from the substrate 241 shown in FIG. 5. The n-type conductive substrate 291 has the structure of a Zener diode with a p-type impurity area 292. The p-type impurity area 292 is obtained prior to the connection of the second emitting unit 280 to the n-type GaAs substrate 291.

The first emitting unit 270 is formed on one area of the n-type GaAs substrate 291, and includes an n-type AlGaInP clad layer 271, an AlGaInP red active layer 273 with a multi-quantum well structure for emitting red light, and a p-type AlGaInP clad layer 275. The first emitting unit 270 is obtained by growing the n-type AlGaInP clad layer 271, the AlGaInP red active layer 273 and the p-type AlGaInP clad layer 275 directly on the n-type GaAs substrate 291. More specifically, the n-type AlGaInP clad layer 271, the AlGaInP red active layer 273 and the p-type AlGaInP clad layer 275 are grown on the n-type GaAs substrate 291, and then selectively etched at an area for mounting the second emitting unit 280 thereon.

Thereafter, an insulating layer 293 made of $SiO_2$ is formed on the entire surface of the first emitting unit 270 except for an area for forming a p-type electrode 297 thereon.

The second emitting unit 280 is formed on the area different from the area for forming the first emitting unit 270 thereon, and includes a p-type AlGaP clad layer 281, a GaN/InGaN green active layer 283 with a multi-quantum well structure, an undoped GaN clad layer 285, a GaN/InGaN blue active layer 287 with a multi-quantum well structure, and an n-type GaN clad layer 289.

The second emitting unit 280 is a separate component grown on an n-type GaN substrate 288 by a separate process, but have a horizontal structure different from the second emitting unit 230 shown in FIG. 5. That is, the p-type AlGaP clad layer 281, the GaN/InGaN green active layer 283, the undoped GaN clad layer 285, and the GaN/InGaN blue active layer 287 are selectively etched so that the n-type GaN clad layer 289 is partially exposed.

Accordingly, this embodiment employs a different connection method of the second emitting unit 280 to the n-type GaAs substrate 291. More specifically, the p-type clad layer 281 of the second emitting unit 280 is connected to the p-type impurity area 292 by a metal adhesive layer 298, and the exposed surface of the n-type clad layer 289 is connected to the n-type GaAs substrate 291 by another metal adhesive layer 299.

An n-type electrode 295 is formed on the lower surface of the n-type GaAs substrate 291, and the p-type electrode 297 is formed on the p-type clad layer 275 of the first emitting unit 270. Also, the metal adhesive layer 298 for connecting the p-type clad layer 281 to the p-type impurity area 292 of the n-type GaAs substrate 291 serves as a p-type electrode of the second emitting unit 280. That is, when the white light emitting diode 300 in accordance with this embodiment is packaged, the surface of the n-type GaAs substrate 291 provided with the first and second emitting units 270 and 280 faces upward, and the p-type electrode 270 of the first emitting unit 270, and the p-type impurity area 292 or the metal adhesive layer 298 are connected to a lead frame (not shown) by wire-bonding.

In the embodiments shown in FIGS. 5 and 6, the conductive substrate 241 or 291 may be a different substrate such as a GaN substrate, and as shown in FIG. 3, the second emitting unit 230 or 280 as well as the first emitting unit 220 or 270 may be grown directly on the substrate 241 or 291, so that blue and green light emitted from the second emitting unit 230 or 280 and red light emitting from the first emitting unit 220 or 270 are combined into desired white light. However, the present invention is not limited thereto.

As apparent from the above description, the present invention provides a white light emitting diode, comprising two emitting units for emitting light of two or three wavelength bands, which are combined into white light, without the use of a luminescent material, and a method for manufacturing the white light emitting diode, thereby preventing the lowering of optical efficiency due to the use of the luminescent material and obtaining excellent color sensitivity and improved optical efficiency. Further, since the two emitting units are arranged in parallel on a single conductive substrate, the white light emitting diode of the present invention can be simply manufactured at low production cost, compared to a white light emitting diode comprising a plurality of LEDs produced as separate components.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

For example, the conductive-types of the crystalline layers or the substrates may be reversed. Further, an emitting unit including a red or reddish yellow active layer may be made of one selected from the group consisting or AlGaInP, GaP, GaAs, and InN semiconductor materials.

What is claimed is:

1. A white light emitting diode comprising:
    a conductive substrate with a light transmitting property having a first surface divided into first and second areas and a second surface being opposed to the first surface;
    a first emitting unit including a first clad layer, a first active area, and a second clad layer, sequentially formed at the first area of the conductive substrate;
    a second emitting unit including a third clad layer, a second active area emitting light with a wavelength to be combined with light emitted from the first active area into white light, and a fourth clad layer, sequentially formed at the second area of the conductive substrate; and
    first, second and third electrodes, said first electrode connected to the second surface of the conductive substrate, said second electrode connected to the second clad layer, and said third electrode connected to the fourth clad layer.

2. The white light emitting diode as set forth in claim 1, wherein the conductive substrate is made of a material which can transmit at least blue light.

3. The white light emitting diode as set forth in claim 2, wherein the conductive substrate is a GaN substrate.

4. The white light emitting diode as set forth in claim 1, wherein the first and third clad layers are made of a first conductive-type semiconductor material, and the second and fourth clad layers are made of a second conductive-type semiconductor material.

5. The white light emitting diode as set forth in claim 4, wherein:
    the first active area of the first emitting unit includes a green active layer formed on the first clad layer, an undoped clad layer formed on the green active layer, and a blue active layer formed on the undoped clad layer; and
    the second active area of the second emitting unit includes an active layer for emitting red light.

6. The white light emitting diode as set forth in claim 5, wherein:
    the first clad layer is made of a first conductive-type GaN compound semiconductor material;
    the green active layer is a GaN/InGaN layer with a multi-quantum well structure;
    the undoped clad layer is made of a GaN compound semiconductor material;
    the blue active layer is a GaN/InGaN layer with a multi-quantum well structure; and
    the second clad layer is made of a second conductive-type AlGaN compound semiconductor material.

7. The white light emitting diode as set forth in claim 1, wherein the second emitting unit is made of one semiconductor material selected from the group consisting of AlGaInP, GaP, GaAs, and InN.

8. The white light emitting diode as set forth in claim 1, wherein the second and third electrodes are integrally formed.

9. The white light emitting diode as set forth in claim 1, further comprising an insulating layer interposed between the first emitting unit and the second emitting unit.

10. The white light emitting diode as set forth in claim 9, wherein the insulating layer is formed on the entire surface of the first emitting unit except for an area at which the second electrode is formed.

11. A white light emitting diode comprising:
    a conductive substrate having a first surface divided into first and second areas and a second surface being opposed to the first surface;
    a first emitting unit including a first clad layer, a first active area, and a second clad layer, sequentially formed at the first area of the conductive substrate;
    a second emitting unit, including a third clad layer, a second active area emitting light with a wavelength to be combined with light emitted from the first active area into white light, and a fourth clad layer, connected to the second area of the conductive substrate by a metal adhesive layer; and
    a first electrode connected to the second surface of the conductive substrate, and a second electrode connected to the second clad layer.

12. The white light emitting diode as set forth in claim 11, wherein:
    the first active area of the first emitting unit includes an active layer for emitting red light; and
    the second active area of the second emitting unit includes a green active layer formed on the third clad layer, an undoped clad layer formed on the green active layer, and a blue active layer formed on the undoped clad layer.

13. The white light emitting diode as set forth in claim 12, wherein:
the third clad layer is made of a first conductive-type GaN compound semiconductor material;
the green active layer is a GaN/InGaN layer with a multi-quantum well structure;
the undoped clad layer is made of a QaN compound semiconductor material;
the blue active layer is a GaN/InGaN layer with a multi-quantum well structure; and
the fourth clad layer is made of a second conductive-type AlGaN compound semiconductor material.

14. The white light emitting diode as set forth in claim 11, wherein the first emitting unit is made of one semiconductor material selected from the group consisting of AlGaInP, GaP, GaAs, and InN.

15. The white light emitting diode as set forth in claim 11, wherein the conductive substrate is a first conductive-type substrate.

16. The white light emitting diode as set forth in claim 15, wherein the conductive substrate is a first conductive-type GaAs substrate.

17. The white light emitting diode as set forth in claim 15, wherein the first and third clad layers are made of a first conductive-type semiconductor material, and the second and fourth clad layers are made of a second conductive-type semiconductor material.

18. The white light emitting diode as set forth in claim 15, wherein the second emitting unit further includes a second conductive-type substrate formed on the fourth clad layer, and a third electrode formed on the second conductive-type substrate.

19. The white light emitting diode as set forth in claim 11, wherein the conductive substrate is a second conductive-type GaAs substrate provided with a first conductive-type impurity area, and the third clad layer of the second emitting unit is connected to the first conductive-type impurity area.

20. The white light emitting diode as set forth in claim 19, wherein the first and fourth clad layers are made of a second conductive-type semiconductor material, and the second and third clad layers are made of a first conductive-type semiconductor material.

21. The white light emitting diode as set forth in claim 19, wherein:
the second emitting unit includes an exposed surface of the fourth clad layer, being opposed to the first conductive-type substrate, obtained by partially removing the third clad layer and the second active area; and
the exposed surface of the fourth clad layer is connected to the first conductive-type substrate by a metal adhesive layer.

22. The white light emitting diode as set forth in claim 19, wherein the second emitting unit further includes a GaN substrate formed on the fourth clad layer.

23. The white light emitting diode as set forth in claim 11, further comprising an insulating layer interposed between the first emitting unit and the second emitting unit.

24. The white light emitting diode as set forth in claim 23, wherein the insulating layer is formed on the entire surface of the first emitting unit except for an area at which the second electrode is formed.

* * * * *